United States Patent
Vogtmann et al.

(10) Patent No.: US 6,672,943 B2
(45) Date of Patent: Jan. 6, 2004

(54) ECCENTRIC ABRASIVE WHEEL FOR WAFER PROCESSING

(75) Inventors: Michael Vogtmann, Pleasanton, CA (US); Krishna Vepa, Livermore, CA (US); Michael Wisnieski, Pleasanton, CA (US)

(73) Assignee: Wafer Solutions, Inc., Fremont, CA (US)

( * ) Notice: Subject to any disclaimer, the term of this patent is extended or adjusted under 35 U.S.C. 154(b) by 0 days.

(21) Appl. No.: 09/845,710

(22) Filed: Apr. 30, 2001

(65) Prior Publication Data
US 2002/0102920 A1 Aug. 1, 2002

Related U.S. Application Data
(60) Provisional application No. 60/264,569, filed on Jan. 26, 2001.

(51) Int. Cl.$^7$ ................................. B24G 1/00
(52) U.S. Cl. ................. 451/41; 451/259; 451/287; 451/548
(58) Field of Search ............... 451/41, 64–66, 451/259, 270, 287–291, 397, 398, 402, 540, 548, 550, 283, 285, 286

(56) References Cited

U.S. PATENT DOCUMENTS

| | | | |
|---|---|---|---|
| 4,054,010 A | 10/1977 | Shipman | 451/159 |
| 4,066,943 A | 1/1978 | Roch | 318/468 |
| 4,149,343 A | 4/1979 | Feldmeier | 451/63 |
| 4,853,286 A | 8/1989 | Narimatsu et al. | 428/343 |
| 4,941,293 A | 7/1990 | Ekhoff | 451/342 |
| 5,056,971 A | 10/1991 | Sartori | 409/201 |
| 5,173,863 A | 12/1992 | Martin | 700/164 |
| 5,178,461 A | 1/1993 | Taniguchi | 366/332 |
| 5,209,760 A * | 5/1993 | Wiand | 51/293 |
| 5,476,566 A | 12/1995 | Cavasin | |
| 5,494,862 A | 2/1996 | Kato et al. | 438/693 |
| 5,549,511 A | 8/1996 | Cronin et al. | 451/281 |
| 5,567,503 A * | 10/1996 | Sexton et al. | 428/137 |
| 5,579,212 A | 11/1996 | Kato et al. | |

(List continued on next page.)

FOREIGN PATENT DOCUMENTS

| | | |
|---|---|---|
| EP | 0776030 A2 | 5/1997 |
| EP | 0940219 A2 | 9/1999 |
| EP | 1050374 A2 | 11/2000 |
| JP | 61-152358 A | 7/1986 |

(List continued on next page.)

OTHER PUBLICATIONS

Systems Dynamics, Inc. web page, www.sysdyn.com/expages/LMIS.htm, May 2, 2001, 2 pages.
GSI Lumonics WaferMark® SigmaXC Nd:YLF–Laser Marking System, www.marwell.se/mis2/15wmsxc.html, May 5, 2001, 2 pages.
Norbert Maurer et al., *High Spped Laser Marking Pen–type Nd: YAG Systems*, Semiconductor–Fabtech.com TAP Resource, www.fabtech.org/features/tap/articles/02.309.html, May 2, 2001, pp. 1–6.

Primary Examiner—Joseph J. Hail, III
Assistant Examiner—David B. Thomas
(74) Attorney, Agent, or Firm—Townsend and Townsend and Crew LLP

(57) ABSTRACT

The present invention provides exemplary methods, systems and apparatus that provide improved substrate characteristics after grinding operations by avoiding or reducing over-grind damage to the wafers. In one embodiment, a grinding apparatus (100) includes a first spindle (110) having an eccentric-shaped abrasive matrix (112) coupled thereto and a second spindle (116) adapted to hold a substrate (118) to be ground. The second spindle is offset from said first spindle such that the abrasive matrix passes through the substrate surface center (134) for only a portion of the time during grinding operations.

19 Claims, 8 Drawing Sheets

U.S. PATENT DOCUMENTS

| | | | |
|---|---|---|---|
| 5,582,534 A | 12/1996 | Shendon et al. | 451/41 |
| 5,679,055 A | 10/1997 | Greene et al. | 451/10 |
| 5,697,832 A | 12/1997 | Greenlaw et al. | 451/291 |
| 5,733,175 A | 3/1998 | Leach | 451/41 |
| 5,735,731 A | 4/1998 | Lee | 451/143 |
| 5,755,614 A | 5/1998 | Adams et al. | 451/60 |
| 5,800,725 A | 9/1998 | Kato et al. | 216/88 |
| 5,820,449 A | 10/1998 | Clover | 451/287 |
| 5,821,166 A | 10/1998 | Hajime et al. | 438/691 |
| 5,827,779 A | 10/1998 | Masumura et al. | 438/691 |
| 5,830,045 A | 11/1998 | Togawa et al. | 451/288 |
| 5,842,910 A * | 12/1998 | Krywanczyk et al. | 451/285 |
| 5,849,636 A | 12/1998 | Harada et al. | 438/691 |
| 5,851,664 A | 12/1998 | Bennett et al. | 428/355 BL |
| 5,851,924 A | 12/1998 | Nakazawa et al. | 438/691 |
| 5,855,735 A | 1/1999 | Takada et al. | 438/691 |
| 5,865,578 A | 2/1999 | Benedikter et al. | 407/233 |
| 5,879,222 A * | 3/1999 | Robinson | 451/285 |
| 5,880,027 A | 3/1999 | Hajime et al. | 438/690 |
| 5,899,743 A | 5/1999 | Kai et al. | 438/690 |
| 5,913,712 A | 6/1999 | Molinar | 451/41 |
| 5,941,759 A | 8/1999 | Kitajima et al. | 451/41 |
| 5,942,445 A | 8/1999 | Kato et al. | 438/691 |
| 5,951,374 A | 9/1999 | Kato et al. | 451/41 |
| 5,697,882 A | 10/1999 | Duescher | 451/57 |
| 5,963,821 A | 10/1999 | Kai et al. | 451/41 |
| 5,964,646 A | 10/1999 | Kassir et al. | 451/41 |
| 5,972,234 A | 10/1999 | Weng et al. | |
| 5,976,260 A | 11/1999 | Kinoshita et al. | 118/719 |
| 5,980,366 A | 11/1999 | Waddle et al. | 451/262 |
| 5,981,391 A | 11/1999 | Yamada | 438/690 |
| 5,985,045 A | 11/1999 | Kobayashi | 148/240 |
| 6,036,582 A | 3/2000 | Aizawa et al. | 451/41 |
| 6,042,459 A | 3/2000 | Honda | 451/274 |
| 6,046,117 A | 4/2000 | Bauer et al. | 438/691 |
| 6,050,880 A | 4/2000 | Kato et al. | 451/41 |
| 6,056,631 A | 5/2000 | Brown et al. | 451/288 |
| 6,063,232 A | 5/2000 | Terasawa et al. | 156/345.23 |
| 6,077,149 A | 6/2000 | Ohkuni et al. | 451/41 |
| 6,089,963 A * | 7/2000 | Wiand et al. | 451/390 |
| 6,095,897 A | 8/2000 | Stocker et al. | 451/5 |
| 6,095,904 A | 8/2000 | Breivogel et al. | 451/41 |
| 6,102,784 A | 8/2000 | Lichner | 451/262 |
| 6,103,636 A | 8/2000 | Zahorik, et al. | 438/745 |
| 6,114,245 A | 9/2000 | Vandamme et al. | 438/690 |
| 6,116,987 A * | 9/2000 | Kubo | 451/264 |
| 6,121,111 A | 9/2000 | Jang et al. | 438/401 |
| 6,132,289 A | 10/2000 | Labunsky et al. | 451/6 |
| 6,132,294 A | 10/2000 | Lin | 451/41 |
| 6,149,507 A | 11/2000 | Lee et al. | 451/66 |
| 6,152,806 A | 11/2000 | Nystrom | 451/36 |
| 6,156,676 A | 12/2000 | Sato et al. | 438/798 |
| 6,159,827 A | 12/2000 | Kataoka et al. | 438/464 |
| 6,162,112 A | 12/2000 | Miyazaki et al. | 451/36 |
| 6,168,506 B1 | 1/2001 | McJunken | 451/259 |
| 6,180,527 B1 | 1/2001 | Farnworth et al. | |
| 6,183,352 B1 | 2/2001 | Kurisawa | 451/87 |
| 6,184,139 B1 | 2/2001 | Adams et al. | 438/691 |
| 6,184,141 B1 | 2/2001 | Avanzino et al. | 438/692 |
| 6,196,904 B1 | 3/2001 | Matsuo et al. | 451/288 |
| 6,210,259 B1 | 4/2001 | Malkin et al. | 451/166 |
| 6,217,433 B1 | 4/2001 | Herrman et al. | 451/548 |
| 6,220,949 B1 | 4/2001 | Hayashi et al. | 451/548 |
| 6,224,473 B1 | 5/2001 | Miller et al. | 451/461 |
| 6,225,136 B1 | 5/2001 | Lydon et al. | 438/14 |
| 6,227,944 B1 | 5/2001 | Xin et al. | 451/41 |
| 6,227,950 B1 | 5/2001 | Hempel et al. | 451/66 |
| 6,239,039 B1 | 5/2001 | Nihonmatsu et al. | 438/749 |
| 6,270,392 B1 * | 8/2001 | Hayashi et al. | 451/10 |
| 6,270,395 B1 * | 8/2001 | Towery et al. | 451/28 |
| 6,309,279 B1 | 10/2001 | Bowman et al. | |
| 6,312,320 B2 | 11/2001 | Sato et al. | 451/285 |
| 6,354,918 B1 * | 3/2002 | Togawa et al. | 541/283 |
| 6,358,117 B1 * | 3/2002 | Kato et al. | 451/158 |
| 6,358,125 B2 | 3/2002 | Kawashima et al. | 451/60 |
| 6,361,202 B1 | 3/2002 | Lee et al. | 366/165.2 |
| 6,376,395 B2 | 4/2002 | Vasat et al. | 438/795 |
| 6,391,779 B1 | 5/2002 | Skrovan | 438/691 |
| 6,399,498 B1 | 6/2002 | Masumura et al. | |
| 6,402,594 B1 | 6/2002 | Kobayashi et al. | |
| 6,406,364 B1 | 6/2002 | Kimura et al. | 451/446 |
| 6,419,574 B1 * | 7/2002 | Takahashi et al. | 451/443 |
| 6,431,959 B1 | 8/2002 | Mikhaylich et al. | 451/41 |
| 6,479,386 B1 | 11/2002 | Ng et al. | |
| 6,491,836 B1 | 12/2002 | Kato et al. | 216/88 |
| 2001/0006882 A1 | 7/2001 | Finkenzeller et al. | |
| 2002/0048213 A1 | 4/2002 | Wilmer et al. | |

FOREIGN PATENT DOCUMENTS

| | | |
|---|---|---|
| JP | 63-134168 A | 6/1988 |
| JP | 6-295891 A | 10/1994 |
| JP | 10-146751 A | 6/1998 |
| JP | 10-242088 A | 9/1998 |
| JP | 10-256203 A | 9/1998 |
| WO | WO 99/09588 A1 | 2/1999 |
| WO | WO 99/31723 A1 | 6/1999 |

* cited by examiner

ellipsis …

ECCENTRIC ABRASIVE WHEEL FOR WAFER PROCESSING

CROSS-REFERENCES TO RELATED APPLICATIONS

This application claims the benefit of the following U.S. Patent Applications, the complete disclosures of which are incorporated herein by reference:

U.S. Provisional Application No. 60/264,569 filed on Jan. 26, 2001;

U.S. patent application Ser. No. 09/808,790, entitled "Cluster Tool Systems and Methods for Processing Wafers, ", filed on Mar. 15, 2001; and U.S. patent application Ser. No. 09/808,748, entitled "Cluster Tool Systems and Methods to Eliminate Wafer Waviness During Grinding,", filed on Mar. 15, 2001.

BACKGROUND OF THE INVENTION

The present invention is directed to the processing of wafers, substrates or disks, such as silicon wafers, and more specifically to cluster tool systems, equipment and methods for processing wafers prior to device formation.

Wafers or substrates with exemplary characteristics must first be formed prior to the formation of circuit devices. In determining the quality of the semiconductor wafer, the flatness of the wafer is a critical parameter to customers since wafer flatness has a direct impact on the subsequent use and quality of semiconductor chips diced from the wafer. Hence, it is desirable to produce wafers having as near a planar surface as possible.

In a current practice, cylindrical boules of single-crystal silicon are formed, such as by Czochralski (CZ) growth process. The boules typically range from 100 to 300 millimeters in diameter. These boules are cut with an internal diameter (ID) saw or a wire saw into disc-shaped wafers approximately one millimeter (mm) thick. The wire saw reduces the kerf loss and permits many wafers to be cut simultaneously. However, the use of these saws results in undesirable waviness of the surfaces of the wafer. For example, the topography of the front surface of a wafer may vary by as much as 1–2 microns ($\mu$) as a result of the natural distortions or warpage of the wafer as well as the variations in the thickness of the wafer across its surface. It is not unusual for the amplitude of the waves in each surface of a wafer to exceed fifteen (15) micrometers. The surfaces need to be made more planar (planarized) before they can be polished, coated or subjected to other processes.

Planarizing processes include lapping or grinding, followed by polishing steps. A lapping process, for example, may be performed to control thickness and remove bow and warp of the silicon wafer. The wafer is simultaneously lapped on both sides with an abrasive slurry in a lapping machine. The lapping process may involve one or more lapping steps with increasingly finer polishing grit. The lapping process, however, is slow and must be followed by careful cleaning and etching steps to relieve stresses before the wafer is polished. These additional steps cause the conventional method to be expensive and time-consuming. Also, the etching process employed after lapping is undesirable from an environmental standpoint, because the large amount of strong acids used must be disposed of in an acceptable way.

In another method, a grinding process replaces the lapping procedure. A first surface of the wafer is drawn or pushed against a hard flat holder while the second surface of the wafer is ground flat. Current grinding technology uses an abrasive wheel with a circular shaped diamond segment (bit) pattern as shown in FIG. 1A. This practice, however, causes the center of the wafer to be in constant contact with the grind segments (FIG. 1B). The constant contact in the center of the wafer is believed to create excess grinding at the wafer center relative to the wafer edge. Such a result tends to cause greater subsurface damage near the wafer center. For these and other reasons, the above techniques are undesirable.

Additional deficiencies in the current art, and improvements in the present invention, are described below and will be recognized by those skilled in the art.

SUMMARY OF THE INVENTION

The present invention provides exemplary methods, systems and apparatus that provide improved substrate characteristics after grinding operations by avoiding or reducing overgrind damage to the wafers. In one embodiment, an apparatus for grinding a substrate according to the present invention includes a first spindle having an eccentric-shaped abrasive matrix coupled thereto and a second spindle adapted to hold a substrate to be ground. The second spindle is offset from the first spindle.

In one aspect, the grinder further comprises a rotation device for rotating the first and second spindles. In one aspect, the first and second spindles are adapted to rotate such that the abrasive matrix passes through a center of the substrate only a portion of the time during which the first spindle completes a 360 degree rotation.

Preventing constant abrasive contact with the wafer center is accomplished a number of ways in alternative embodiments. In one aspect, the first spindle has a circular shaped surface to which an eccentric-shaped abrasive matrix is coupled. In another aspect, the first spindle has an elliptical shaped surface. The abrasive matrix is coupled near an edge of the elliptical shaped surface. In a particular embodiment, the abrasive matrix comprises a diamond bit pattern, although other abrasive matrix may be used within the scope of the present invention.

In one aspect of the present invention, grinding systems and apparatus further include a translation device coupled to the first spindle and adapted to translate the first spindle in a back and forth motion, or side-to-side motion. Similarly, in one aspect the translation device is coupled to the second spindle and is adapted to translate the second spindle in a back and forth motion, or side-to-side motion. In a particular embodiment, both spindles are translated to further ensure the wafer center is not over ground or over stressed.

In one aspect, the eccentric-shaped abrasive matrix is selected from an elliptical shape and an oval shape. In another aspect, the eccentric-shaped abrasive matrix further comprises a random abrasive matrix pattern.

In one embodiment of the present invention, a substrate grinding apparatus includes a first spindle having an abrasive matrix coupled to a first spindle surface, and a second spindle adapted to hold a substrate to be ground. The first and second spindles have first and second axii of rotation, respectively. The abrasive matrix has a non-circular pattern.

In one aspect, the first and second axii of rotation are generally parallel, and the first spindle is offset from the second spindle. In another aspect, the first and second spindles are adapted to rotate such that the abrasive matrix passes through a center of the wafer or substrate only a portion of the time during which the first spindle completes a 360 degree rotation. Again, the abrasive matrix may comprise a random pattern abrasive matrix.

The present invention further provides exemplary methods of grinding a substrate. In one embodiment, a grinding method includes providing a grinding apparatus as described herein. The spindles are positioned such that the abrasive matrix is in contact with a surface of the substrate. The method includes simultaneously rotating the first and second spindles so that the abrasive matrix contacts the substrate surface, with the abrasive matrix passing through a center of the substrate surface for only a portion of a time the spindles are rotating. In this manner, overgrinding and undue substrate stress can be reduced or avoided.

In one aspect, the grinding method further includes translating the first spindle in a back and forth motion, side-to-side or other motion while the abrasive matrix is in contact with the surface. In another aspect, the translating occurs simultaneous with the first and second spindle rotation. In still another aspect, the first spindle has a circular shaped surface to which an eccentric-shaped abrasive matrix is coupled.

In another method of grinding a substrate according to the present invention, a substrate grinder is provided. The substrate grinder has a first spindle with an abrasive matrix coupled thereto, and a second spindle adapted to hold a substrate to be ground. The first spindle has a first axis of rotation, and the second spindle has a second axis of rotation. The method includes positioning the spindles such that at least a portion of the abrasive matrix is in contact with a substrate surface to be ground, simultaneously rotating the first and second spindles so that the abrasive matrix contacts the substrate surface, and translating the first spindle so that the abrasive matrix passes through a center of the substrate surface for only a portion of a time the spindles are rotating. In this manner, the substrate center is not over ground or over stressed.

Other objects, features and advantages of the present invention will become more fully apparent from the following detailed description, the appended claims and the accompanying drawings.

DESCRIPTION OF THE SPECIFIC EMBODIMENTS

The present invention involves methods and apparatus for reducing the abrasive contact near the center of a wafer during grinding processes. In one embodiment, an elliptical, oval or other eccentric pattern of abrasive matrix segments are bonded to a grinding spindle or wheel. In this manner, the eccentric-patterned abrasive wheel eases set-up and randomizes the grinding process.

Figure 1A:
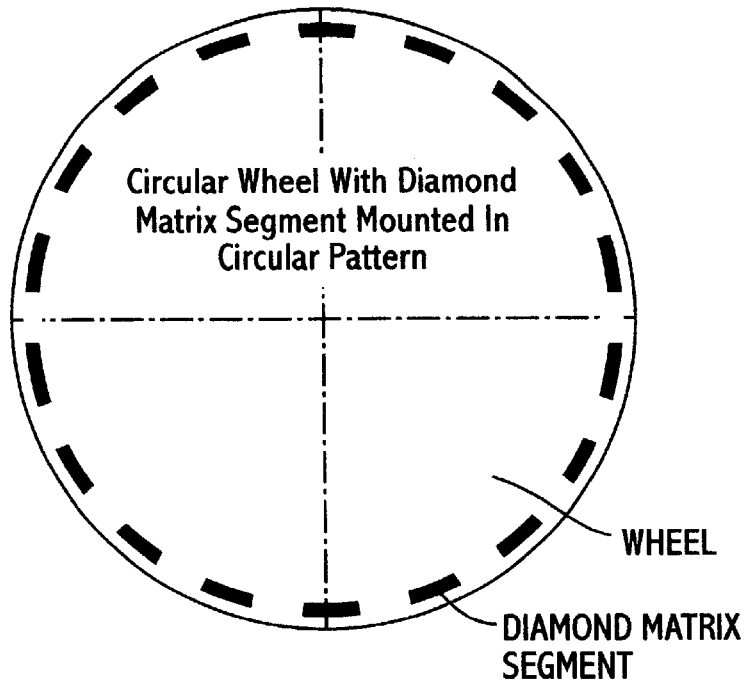
FIG. 1A depicts a prior art circular wheel with a circular diamond matrix segment.
Figure 1B:
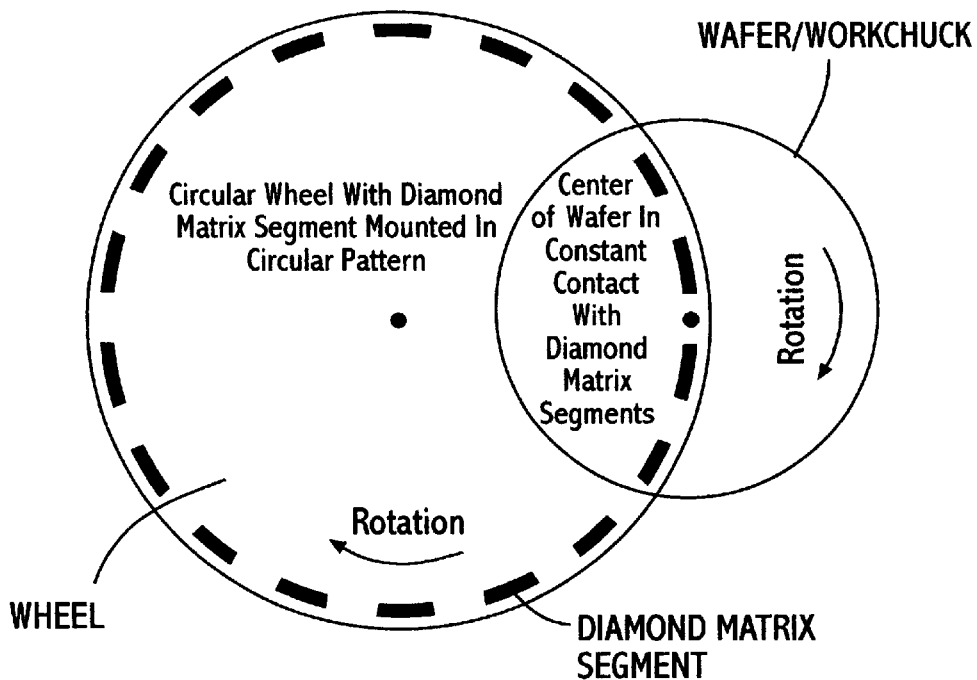
FIG. 1B depicts the prior art wheel shown in FIG. 1A, accompanying a wafer spindle.
Figure 2A:
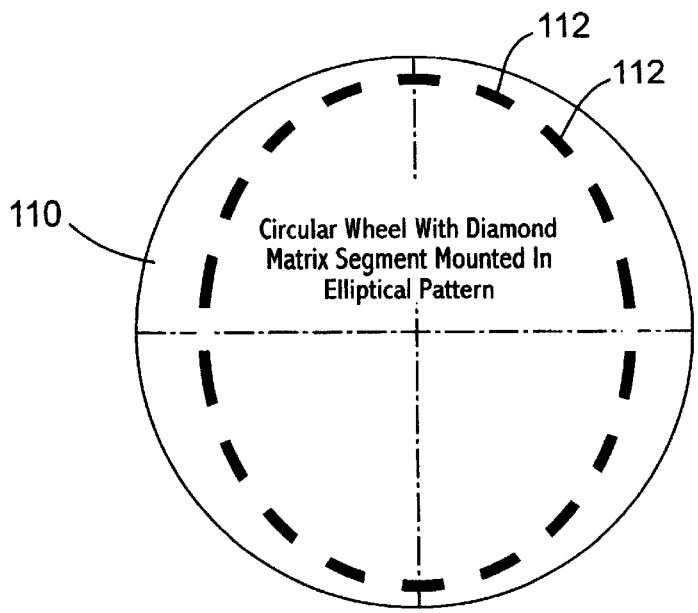
FIG. 2A depicts an eccentric abrasive matrix pattern according to the present invention.
Figure 2B:
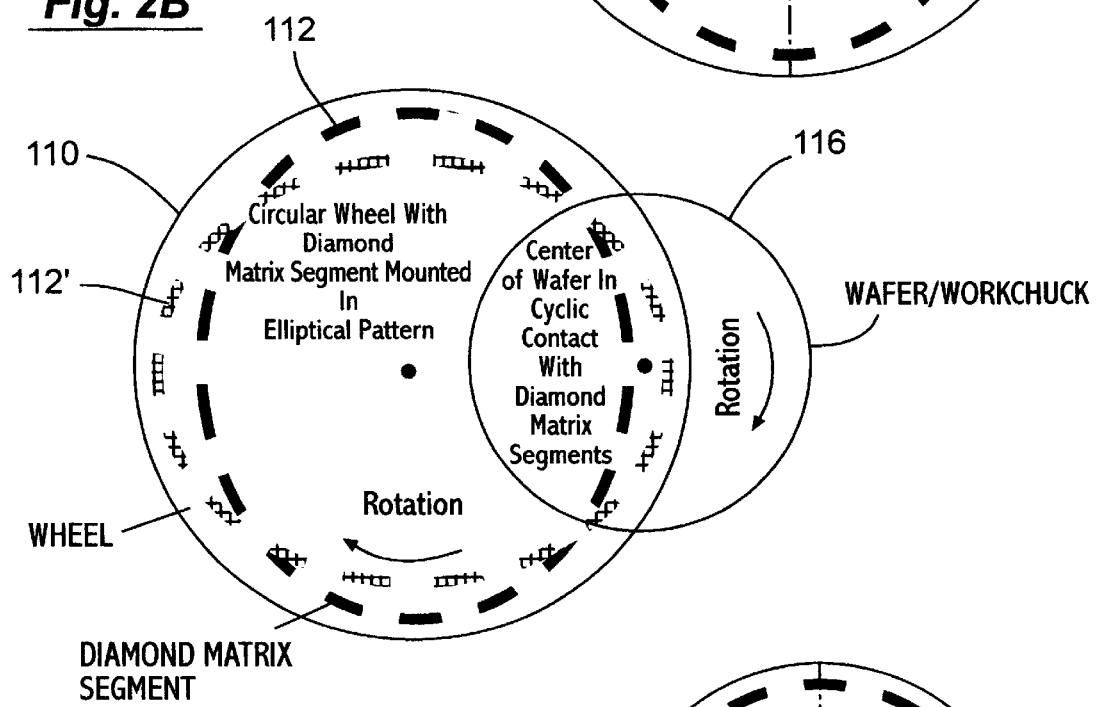
FIG. 2B depicts the present invention embodiment of FIG. 2A with a substrate spindle.
Figure 2C:
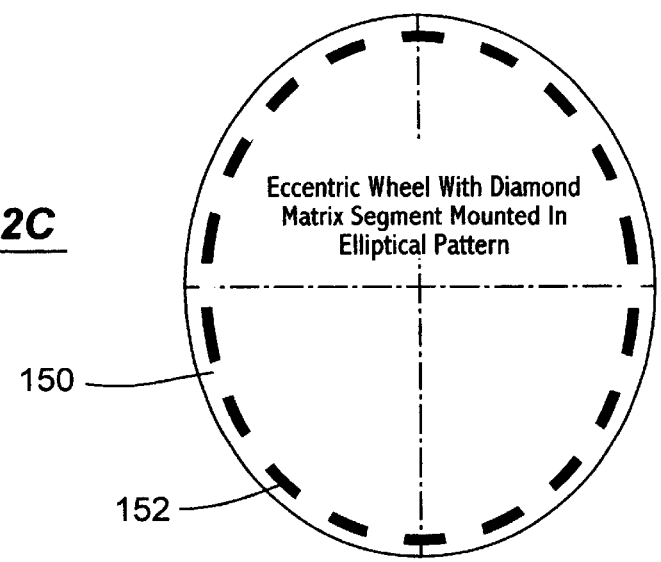
FIG. 2C depicts an eccentric abrasive matrix pattern on an eccentric grind wheel according to the present invention.
Figure 2D:
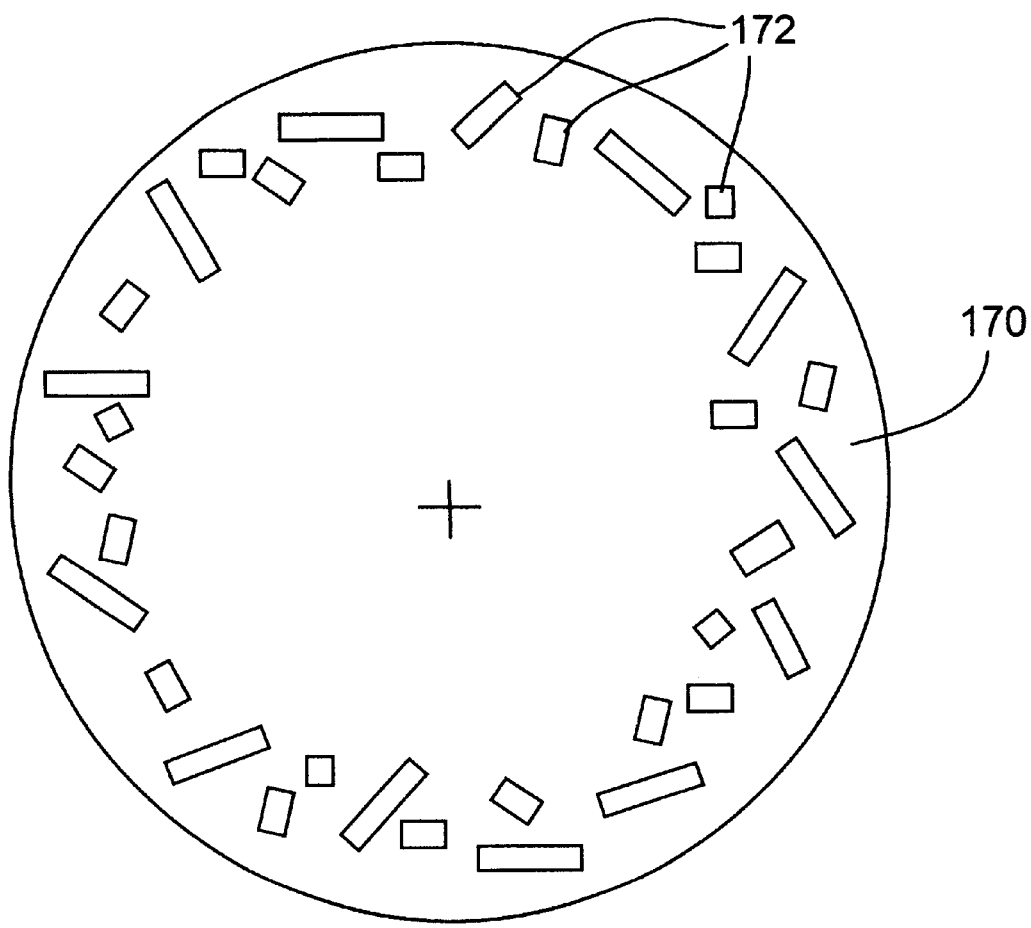
FIG. 2D depicts another embodiment of the present invention having a random abrasive matrix configuration.
Figure 3A:
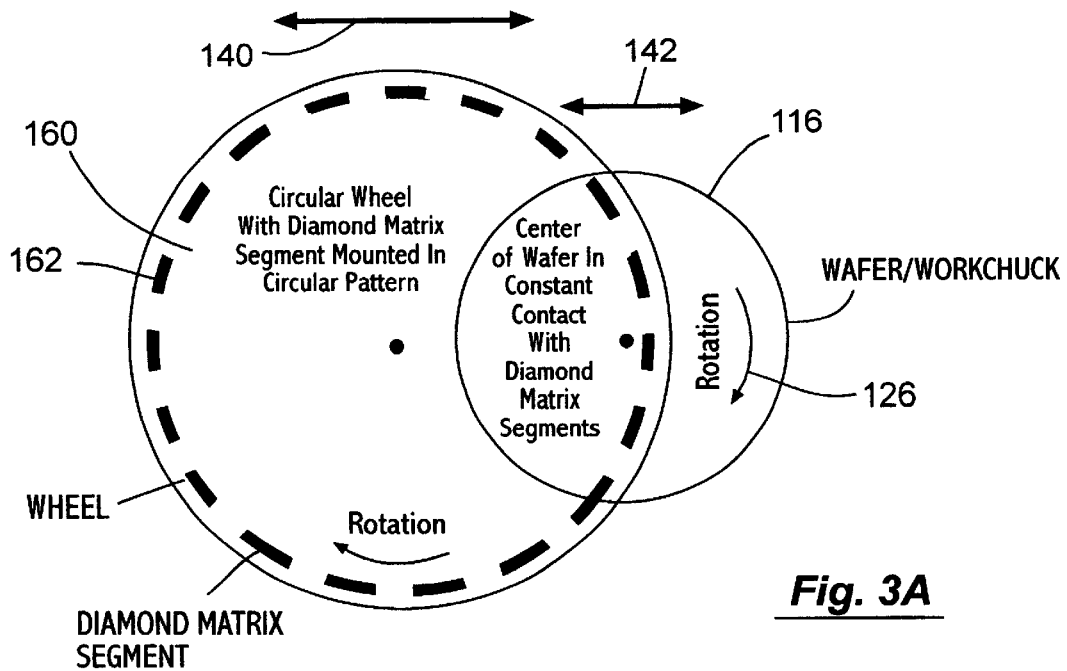
FIGS. 3A–3B depict alternative embodiments of the present invention.
Figure 3B:
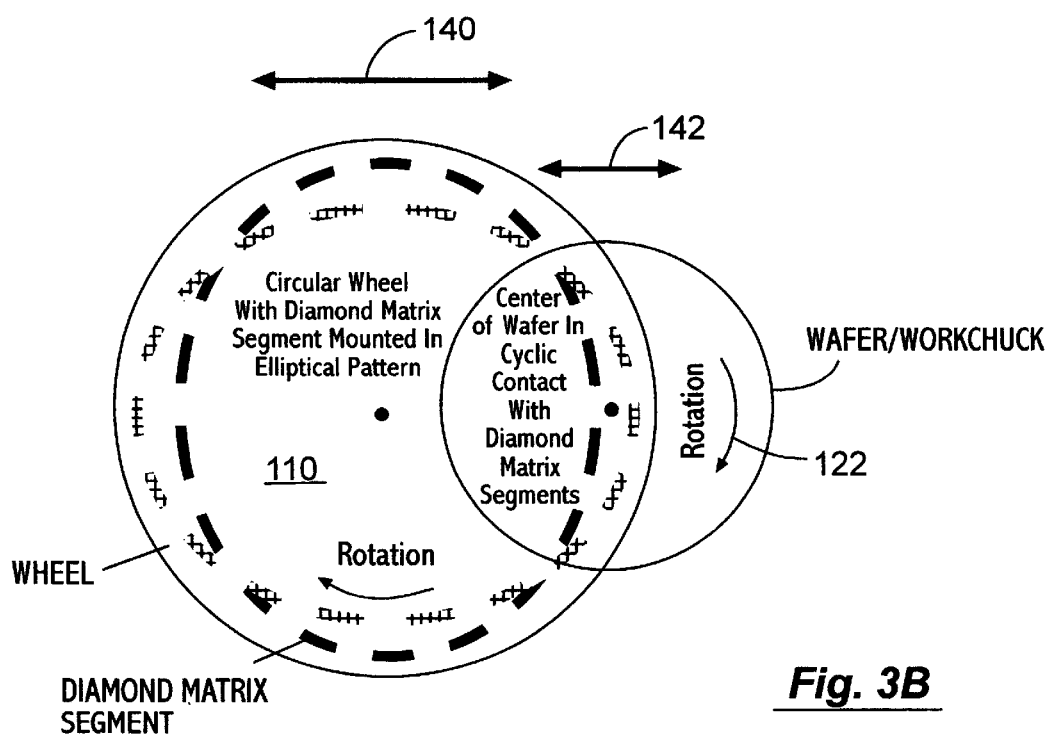
Figure 4:
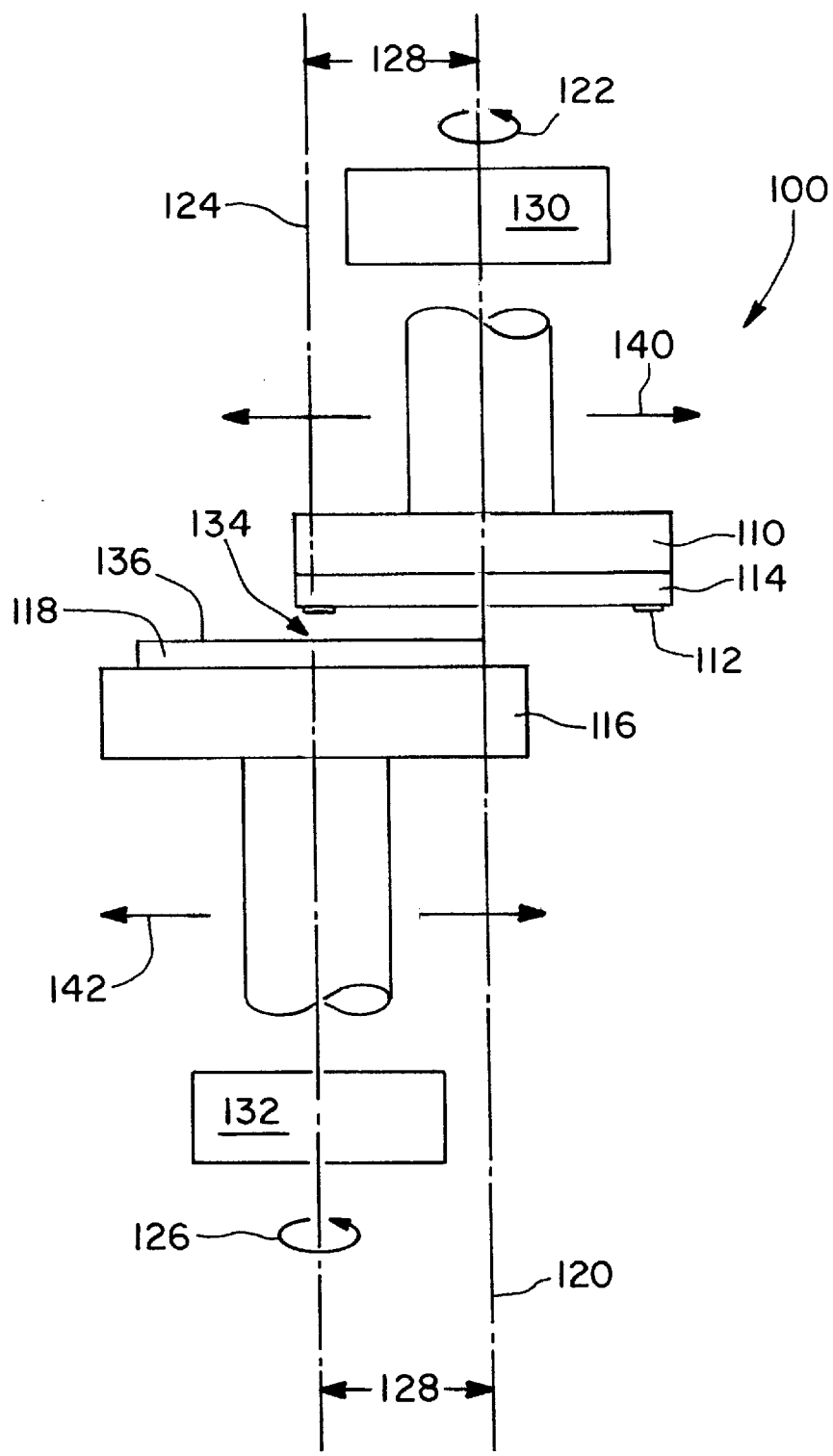
FIG. 4 is simplified schematic of apparatus and systems of the present invention.

Turning now to FIGS. 2A–2D, 3A–3B and 4, embodiments of the present invention will be described. As best shown in FIG. 4, a grinding apparatus 100 includes a first spindle or work chuck 110 having a plate 114 mounted to a surface thereof. Plate 114 has an abrasive matrix or grind segments 112 disposed on or near a surface of plate 114. Abrasive matrix 112 may comprise a diamond matrix, diamond or other grind segments in glass or resin, and the like. In one embodiment, abrasive matrix 112 comprises a plurality of spaced grind segments that are about 3/16 inch by 3/16 inch by 1 inch in size. It will be appreciated by those skilled in the art that different grind segment sizes may be used within the scope of the present invention. Spindle 110 is positioned such that abrasive matrix 112 is adapted to contact a substrate or wafer 118 coupled to a second spindle 116. Substrate 118 may be coupled to second spindle 116 by a variety of methods, including vacuum chucking, temporary adhesives such as putty or wax, and the like. Substrate 118 has a surface 136 to be ground, with surface 136 having a center 134.

First spindle 110 is adapted to rotate about an axis of rotation 120 as indicated by arrow 122 (FIG. 4). Similarly, second spindle 116 is adapted to rotate about an axis of rotation 124 as indicated by arrow 126. Preferably, both spindles rotate through a continuous 360 degree rotation. In one embodiment, rotation speeds range from about 1,800 revolutions per minute (rpm) to about 3,200 rpm, although need not be within this range. In one embodiment, the two axii of rotation 120 and 124 are separated by an offset distance 128. In a particular embodiment, offset distance 128 is about equal to one-half of a diameter of the substrate 118 to be ground, plus or minus about one-half (0.5) inch to about two (2) inches.

As best shown in FIGS. 2A and 2B, abrasive matrix 112 is coupled to plate 114 in a generally eccentric pattern. In some embodiments, matrix 112 has an elliptical pattern, an oval pattern, or the like. In this manner, rotation of spindle 110 causes abrasive matrix 112 to pass through center 134 only a portion of the time during a 360 degree rotation of first spindle 110. As best shown in FIG. 2B, abrasive matrix 112 does not pass through center 134 of substrate 118 when the elliptical pattern is generally aligned from top to the bottom in FIG. 2B. Similarly, abrasive matrix 112' does pass generally through center 134 after a 90 degree rotation of spindle 110 as depicted in FIG. 2B. As will be appreciated by those skilled in the art, continuous 360 degree rotation of first spindle 110 will cause abrasive matrix 112 to effectively translate back and forth along surface 136 through center 134. In this manner, abrasive matrix 112 is not continuously in contact with center 134. As a result, undue stress or overgrind problems are prevented or reduced using apparatus and methods according to the present invention. Such a design allows for center 134 to have less contact with grind segments 112. The area of greater contact between abrasive matrix 112 and substrate surface 136 is much larger and evenly spaced so as to have a negligible damage effect to substrate 118.

Another benefit of the present invention is the elimination of the need to precisely position the abrasive wheel or spindle 110 relative to wafer center 134. As a result, grinder 100 set-up times are reduced.

As shown in FIGS. 2A and 2B, one embodiment of the present invention uses a generally circular first spindle 110 to which abrasive matrix 112 is coupled. Abrasive matrix 112 may be coupled to an outer surface of plate 114. In one embodiment, plate 114 is a grinding pad. Alternatively, abrasive matrix 112 may be disposed within a portion of plate 114. In another embodiment, plate 114 is not use, and abrasive matrix 112 is coupled to or disposed within a surface of first spindle 110.

FIG. 2C depicts an alternative embodiment of the present invention having a first spindle 150 having an eccentric shape. In one embodiment, first spindle 150 has a generally elliptical surface to which an abrasive matrix 152 is coupled. In this embodiment abrasive matrix is coupled near a peripheral edge of first spindle 150.

Turning now to FIG. 2D, still another embodiment of the present invention will be described. FIG. 2D depicts a first spindle 170 having a random abrasive matrix 172 coupled thereto. In this manner, abrasive matrix 172 does not continuously pass through the center of the substrate to be ground.

In alternative embodiments, first spindle 110 and/or second spindle 116 is translated to prevent abrasive matrix 112 from continuously being in contact with center 134. As shown in FIG. 4, in one embodiment first spindle 110 is translated in a back and forth, forward to back, side-to-side, or the like motion as depicted by arrows 140. In a similar manner, second spindle 116 may be translated as indicated by arrows 142. In one embodiment only first spindle 110 is translated, while first spindle rotates about axis 120 and second spindle 116 rotates about axis 124. Alternatively, first spindle 110 rotates about axis 120 without being translated, while second spindle 116 is translated as depicted by arrows 142 and rotated about axis 124. In still another embodiment, both the first and second spindles are rotated about their respective axii 120, 124 and are translated as shown by arrows 140 and 142. In each case, abrasive matrix 112 passes through center 134 of exposed surface 136 for only a portion of the time during the grinding processes. Hence, the resident time wafer center 134 is under the grinding matrix is reduced and wafer damage is reduced.

As shown in FIG. 4, rotation of first spindle 110 may be accomplished by a rotation device 130, and rotation of second spindle 116 may be accomplished using a rotation device 132 coupled to the respective spindles 110, 116. In an alternative embodiment, rotation devices 130 and 132 are a single device. Rotation devices 130, 132 may be coupled together, and/or to spindles 110, 116 using gears, pulleys, cables and the like. In one embodiment, translation as shown by arrows 140 and 142 is accomplished using a translator (not depicted) coupled to one or both spindles. Grinding apparatus 100 may be controlled by a controller (not shown) coupled to spindles 110, 116, rotation devices 130,132, and/or the translator(s).

In still another embodiment as shown in FIG. 3A, a circular spindle 160 having a generally circular abrasive matrix pattern 162 may be used. Absent translation 140, 142, abrasive matrix 162 would continuously pass through center 134 during grinding operations. Instead, one or both spindles are translated as shown by arrows 140 and 142 in FIG. 3A such that abrasive matrix 162 does not continuously pass through or near center 134 of substrate surface 136 to be ground. Such an embodiment may incorporate an actuator and feedback system to facilitate grinding operations. It will be appreciated by those skilled in the art that combinations of eccentric abrasive matrix configurations, eccentric spindle configurations, and translation of one or both spindles may also be used within the scope of the present invention. For example, as shown in FIG. 3B, an eccentric abrasive matrix pattern is used in conjunction with translation of one or both spindles.

With reference to FIG. 4, a method of grinding substrate 118 according to the present invention will be described. Substrate or wafer 118 having surface 136 to be ground is placed on second spindle 116 and coupled thereto to prevent unwanted movements during rotation of second spindle 116. In one embodiment, a vacuum system operates to maintain wafer 118 to spindle 116. First spindle 110 and second spindle 116 are positioned such that abrasive matrix 112 is in contact with substrate surface 136. In one embodiment, the contact between abrasive matrix 112 and substrate 118 occurs simultaneously with rotation of both first and second spindles 110, 116. Center 134 is not subjected to continuous grinding due to the use of one or more techniques described in conjunction with FIGS. 2A–2D and 3A–3B.

Cluster Tool Systems and Methods

Apparatus and methods described in conjunction with FIGS. 2A–2D, 3A–3B and 4 will find use in the cluster tool systems and methods described in conjunction with FIGS. 5 and 6A–6C.

Figure 5:
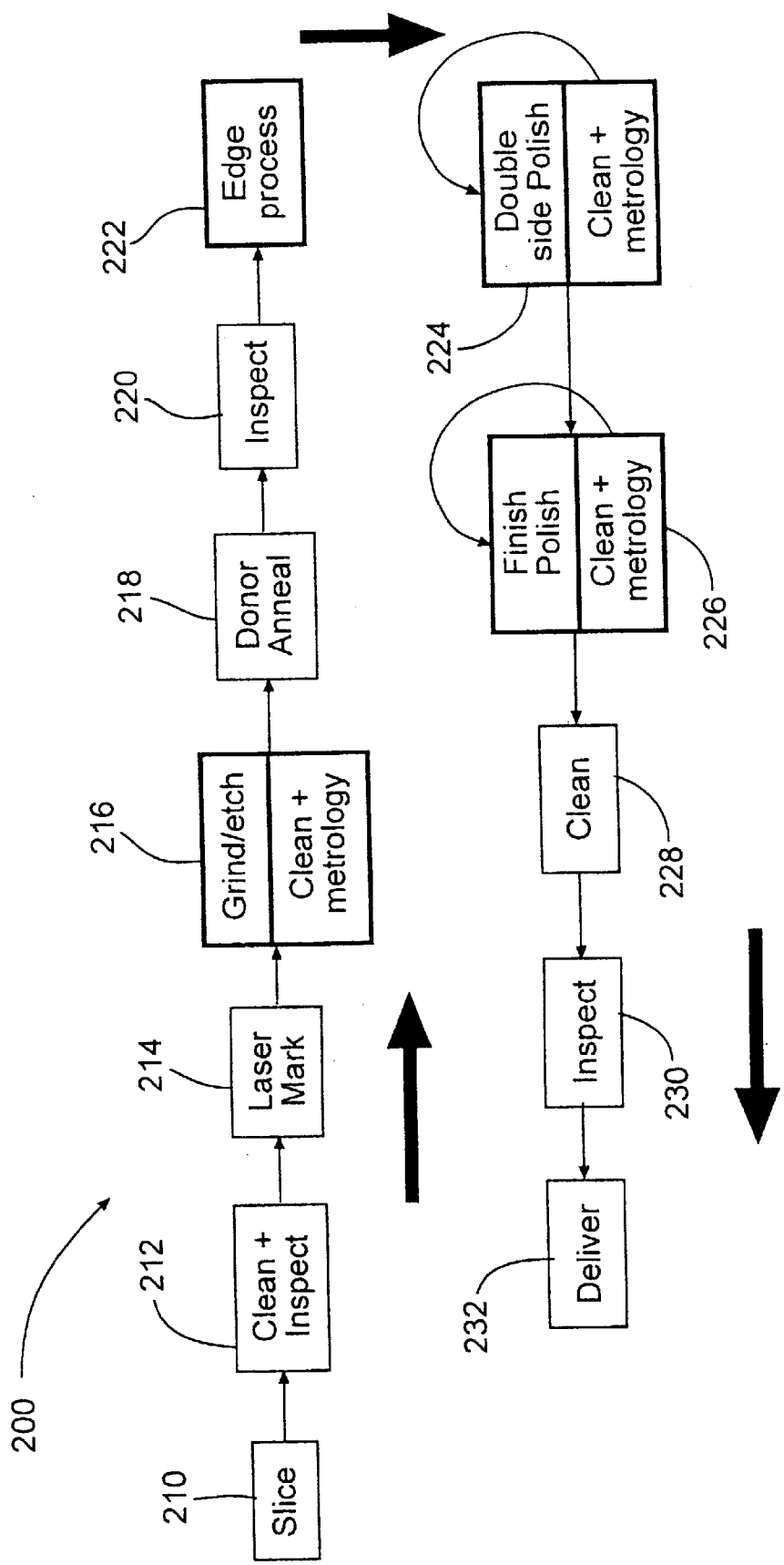
FIG. 5 is a simplified flow diagram of a wafer processing method according to the present invention.

FIG. 5 depicts an exemplary method 200 of the present invention. Method 200 includes a slice process 210, using a wire saw, inner diameter saw or the like, to create a generally disc-shaped wafer or substrate. In one embodiment, the wafer is a silicon wafer. Alternatively, the wafer may comprise polysilicon, germanium, glass, quartz, or other materials. Further, the wafer may have an initial diameter of about 200 mm, about 300 mm, or other sizes, including diameters larger than 300 mm.

The wafer is cleaned and inspected (Step 212) and then may, or may not, be laser-marked (Step 214). Laser marking involves creating an alphanumeric identification mark on the wafer. The ID mark may identify the wafer manufacturer, flatness, conductivity type, wafer number and the like. The laser marking preferably is performed to a sufficient depth so that the ID mark remains even after portions of the wafer have been removed by subsequent process steps such as grinding, etching, polishing, and the like.

Thereafter, the wafer is processed through a first module (Step 216), with details of embodiments of the first module described below in conjunction with FIGS. 6A–6C. First module processing (Step 216) includes a grinding process, an etching process, a cleaning process, metrology testing of the wafer, or some combination thereof. In this module, the use of a grinding process in lieu of lapping helps to remove wafer bow and warpage. The grinding process of the present invention also is beneficial in removing wafer surface waves caused by the wafer slicing in Step 210. Benefits of grinding in lieu of lapping include reduced kerf loss, better thickness tolerance, improved wafer shape for polishing and better laser mark dot depth tolerance, and reduced damage, among others.

The etching process within the first module is a more benign process than prior art etch steps. For example, typical prior art etching may involve the bulk removal of forty (40) or more microns of wafer thickness. In contrast, the etch process of the present invention preferably removes ten (10) microns or less from the wafer thickness. In one embodiment, the first module etch process removes between about two (2) microns to about five (5) microns of wafer material per side, or a total of about four (4) to about ten (10) microns. In another embodiment, the first module etch process removes between about three (3) microns and about four (4) microns of wafer material per side for a total of about six (6) to about (8) microns.

After first module processing, the wafer is subjected to a donor anneal (Step 218) and thereafter inspected (Step 220). The donor anneal removes unstable oxygen impurities within the wafer. As a result, the original wafer resistivity may be fixed. In an alternative embodiment, donor anneal is not performed.

The wafer then is processed through a second module (Step 222) in which an edge process is performed. The edge process includes both an edge profile and an edge polish procedure. Edge profiling may include removing chips from the wafer edge, controlling the diameter of the wafer and/or the creation of a beveled edge. Edge profiling also may involve notching the wafer to create primary and secondary flat edges. The flats facilitate wafer alignment in subsequent processing steps and/or provide desired wafer information (e.g., conductivity type). In one embodiment, one or both flats are formed near the ID mark previously created in the wafer surface. One advantage of the present invention involves performing the edge profiling after wafer grinding. In this manner, chips or other defects to the wafer edge, which may arise during grinding or lapping, are more likely to be removed. Prior art edge profiling occurs before lapping, and edge polishing subsequent to the lapping step may not sufficiently remove edge defects.

The wafer is then processed through a third module (Step 224). A third module process includes a double side polish, a cleaning process and wafer metrology. Wafer polishing is designed to remove stress within the wafer and smooth any remaining roughness. The polishing also helps eliminate haze and light point defects (LPD) within the wafer, and produces a flatter, smoother finish wafer. As shown by the arrow in FIG. 5, wafer metrology may be used to adjust the double side polishing process within the third module. In other words, wafer metrology may be feed back to the double side polisher and used to adjust the DSP device in the event the processed wafer needs to have different or improved characteristics, such as flatness, or to further polish out scratches.

Thereafter, the wafer is subjected to a finish polish, a cleaning process and metrology testing, all within a fourth process module (226). The wafer is cleaned (Step 228), inspected (Step 230) and delivered (Step 232).

The reduced number of clean and inspection steps, particularly near the end of the process flow, are due in part to the exemplary metrology processing of the wafer during prior process steps. Wafer metrology testing may test a number of wafer characteristics, including wafer flatness, haze, LPD, scratches and the like. Wafer flatness may be determined by a number of measuring methods known to those skilled in the art. For example, "taper" is a measurement of the lack of parallelism between the unpolished back surface and a selected focal plane of the wafer. Site Total Indicated Reading (STIR) is the difference between the highest point above the selected focal plane and the lowest point below the focal plane for a selected portion (e.g., 1 square cm) of the wafer, and is always a positive number. Site Focal Plane Deviation (SFPD) is the highest point above, or the lowest point below, the chosen focal plane for a selected portion (e.g., 1 square cm) of the wafer and may be a positive or negative number. Total thickness variation (TTV) is the difference between the highest and lowest elevation of the polished front surface of the wafer.

Further, metrology information, in one embodiment, is fed back and used to modify process parameters. For example, in one embodiment metrology testing in the first module occurs after wafer grinding and may be used to modify the grinding process for subsequent wafers. In one embodiment, wafers are processed through the first module in series. More specifically, each station within the first module processes a single wafer at a time. In this manner, metrology information may be fed back to improve the grinding or other process after only about one (1) to five (5) wafers have been processed. As a result, a potential problem can be corrected before a larger number of wafers have been processed through the problem area, thus lowering costs.

Further, the present invention produces standard process times for each wafer. More specifically, each wafer is subjected to approximately the same duration of grinding, cleaning, etching, etc. The delay between each process also is the same or nearly the same for each wafer. As a result, it is easy to troubleshoot within the present invention methods and systems.

In contrast, prior art methods typically uses a batch process mode for a number of process steps. For example, a batch containing a large number of wafers (say, twenty (20)) may be lapped one to a few at a time (say, one (1) to four (4) at a time). After all twenty have been lapped, the batch of twenty wafers then are cleaned together as a group (Step 24), and etched together as a group (Step 26). As a result, the wafers that were lapped first sit around for a longer period of time prior to cleaning than do the wafers lapped last. This varying delay effects wafer quality, due in part to the formation of a greater amount of haze, light point defects, and other time-dependent wafer defects. One negative outcome of irregular process times is the resultant difficulty in locating potential problems within the process system.

As with the first module, metrology information may be fed back within the second, third and fourth modules. For example, metrology information may be fed back to the double side polisher or finish polisher to adjust those processes to produce improved results. Additionally, in one embodiment, metrology information is fed back within the third and/or fourth module in real time. As a result, process steps such as the double side polishing can be modified during processing of the same wafer on which metrology testing has occurred.

Figure 6A:
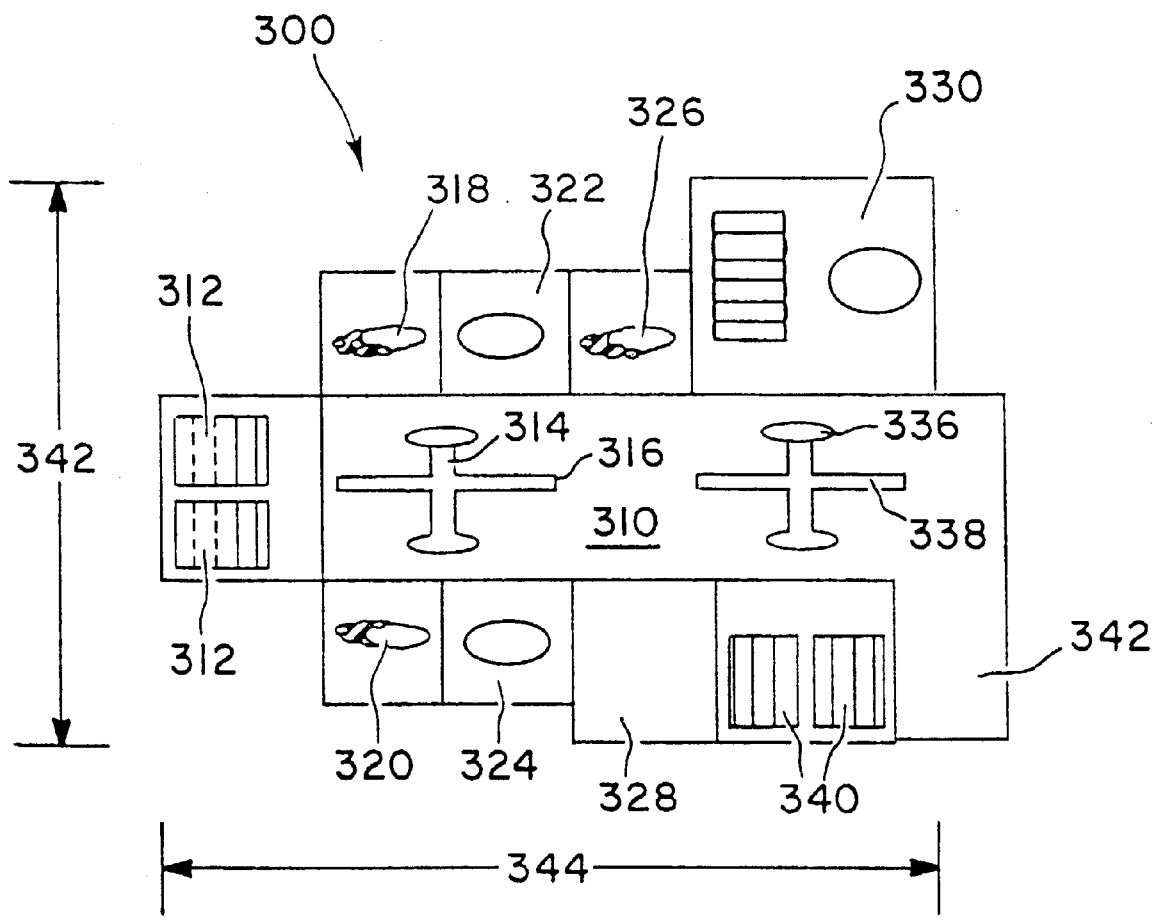
FIGS. 6A–C depict grind damage cluster tools according to the present invention.
Figure 6B:
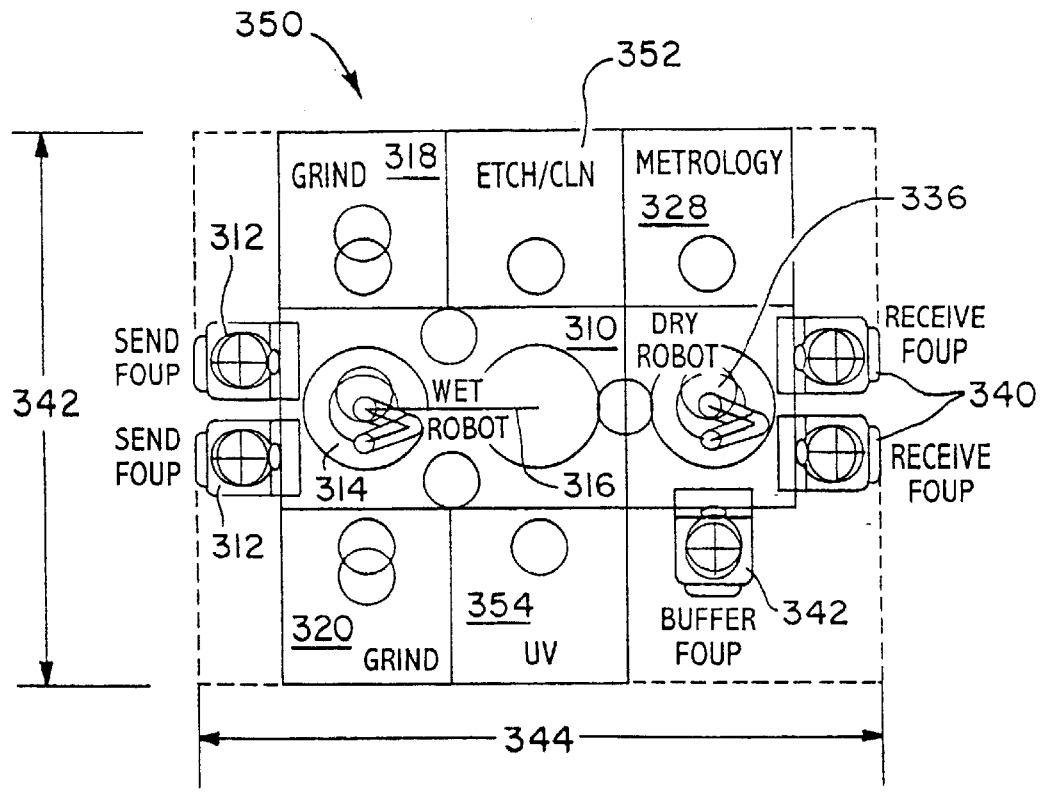
Figure 6C:
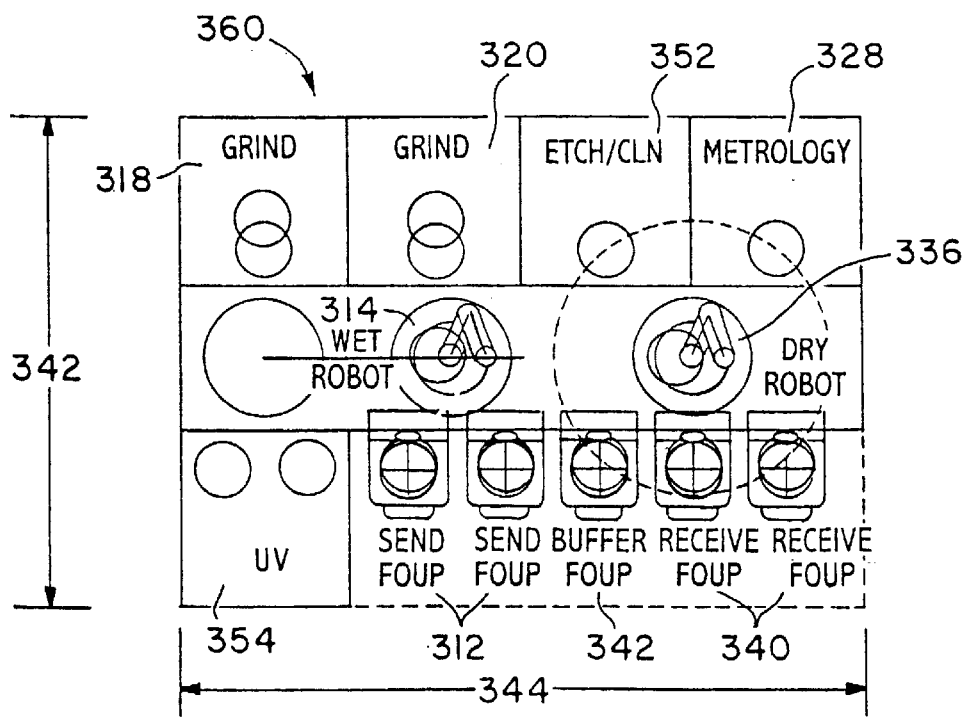

With reference to FIGS. 6A–6C, additional details on grind cluster modules according to the present invention will be provided. It will be appreciated by those skilled in the art that the modules described in FIGS. 6A–C are embodiments of the present invention, from which a large number of variations for each module exist within the scope of the present invention. Further, additional process steps may be removed or added, and process steps may be rearranged within the scope of the present invention. In some embodiments, grinding apparatus 100 as described in conjunction with FIGS. 2–4 are incorporated in the grind clusters of FIG. 6. Details on additional cluster modules are discussed in U.S. application Ser. No. 09/808,790, (Attorney Docket No. 20468-000110), previously incorporated herein by reference.

FIG. 6A depicts a grind damage cluster module described as first module 216 in conjunction with FIG. 5. First module 300 defines a clean room environment 310 in which a series of process steps are carried out. Wafers that have been processed through Step 214 (FIG. 5) are received in first module 300 via a portal, such as a front opening unified pod (FOUP) 312. First module 300 is shown with two FOUPs 312, although a larger or smaller number of FOUPs/portals may be used. FOUPs 312 are adapted to hold a number of wafers so that the frequency of ingress into the clean room environment 310 may be minimized. A transfer device 314, schematically depicted as a robot, operates to remove a wafer from FOUPs 312 and place the wafer on a grinder 318.

If needed, transfer device 314 travels down a track 316 to properly align itself, and hence the wafer, in front of grinder 318. Grinder 318 operates to grind a first side of the wafer. In one embodiment, grinder 318 is grinder 100 as described in FIGS. 2A–4.

The wafer may be held down on grinder 318 by way of a vacuum chuck, and other methods. Once grinder 318 has ground the first side of the wafer, the wafer is cleaned in cleaner 322 and the transfer device 314 transfers the wafer back to grinder 318 for grinding the converse side of the wafer. In one embodiment, wafer grinding of both wafer sides removes about forty (40) microns to about seventy (70) microns of wafer thickness. After the second wafer side is ground, the wafer is again cleaned in cleaner 322. In one embodiment, cleaning steps occur on grinder 318 subsequent to grinding thereon. In one embodiment, cleaning and drying are accomplished by spraying a cleaning solution on the wafer held by or near the edges and spun.

In another embodiment, at least one side of the wafer is subjected to two sequential grinding steps on grinder 318. The two grinding processes preferably include a coarse grind followed by a fine grind. Grinder 318 may include, for example, two different grinding platens or pads with different grit patterns or surface roughness. In one embodiment, the wafer is cleaned on grinder 318 between the two grinding steps to the same wafer side. Alternatively, cleaning may occur after both grinding steps to the same wafer side.

In some embodiments, transfer device 314 transfers the wafer from cleaner 322 to a backside polisher 326. For example, this process flow may occur for 200 mm wafers. In this embodiment, the back side is polished and not ground, or both ground and polished.

As shown in FIG. 6A, a second grinder 320 and a second cleaner 324 are provided within module 300. In this manner, two wafers may be simultaneously processed therethrough. Again, in one embodiment second grinder 320 is grinder 100. Since both grinders 318, 320 have a corresponding cleaner 322, 324, wafer processing times are consistent even if two wafers are being ground simultaneously on grinders 318, 320. In one embodiment, grinders 318 and 320 are used to grind opposite sides of the same wafer. In this case, one side of the wafer is ground on grinder 318 and the other side of the same wafer is ground on grinder 320. As with grinder 318, wafers may be ground on grinder 320 and then cleaned on grinder 320 before removal, or cleaned in cleaner 324.

Once the wafers have been ground, a second transfer device 336, again a robot in one embodiment, operates to transfer the wafer to an etcher 330. Etcher 330 operates to remove material from the wafer, preferably a portion on both primary sides of the wafer. The etching process is designed to remove stresses within the silicon crystal caused by the grinding process. Such an operation, in one embodiment, removes ten (10) microns or less of total wafer thickness. In this manner, etcher 330 operates to remove less wafer material than in prior art etch processes. Further, the present invention requires less etchant solution, and hence poses fewer environmental problems related to disposal of the acids or other etchants.

Wafer metrology is then tested at a metrology station 328. In one embodiment wafer metrology is tested subsequent to grinding on grinder 318, and prior to the etching within etcher 330. Alternatively, wafer metrology is tested subsequent to etching in etcher 330. In still another embodiment, wafer metrology is tested both prior to and subsequent to the etching process. Evaluation of wafer metrology involves the testing of wafer flatness and other wafer characteristics to ensure the wafer conforms to the desired specifications. If the wafer does not meet specifications, the wafer is placed in a recycle area 342, which in one embodiment comprises a FOUP 342 (not shown in FIG. 6A). Wafers with acceptable specifications are placed in an out portal or FOUP 340 for removal from first module 300.

As shown and described in conjunction with FIG. 6A, first module 300 provides an enclosed clean room environment in which a series of process steps are performed. Wafers are processed in series through first module 300. Hence, each wafer has generally uniform or uniform process time through the module as well as generally uniform or uniform delay times between process steps. Further, by immediately cleaning and etching the wafer after grinding, the formation of haze and light point defects (LPD) within the wafer are reduced. Such a module configuration is an improvement over the prior art in which wafers are typically processed during the lapping step in batch mode. As a result, some wafers will wait longer before the cleaning or etching steps than others within the same batch. As a result, haze and other wafer defects vary from wafer to wafer, even between wafers within the same batch. Such a shortcoming of the prior art can make it difficult if not impossible to isolate problems within the wafer process flow in the event defective wafers are discovered.

An additional benefit of first module 300 is its compact size. In one embodiment, module 300 has a width 342 that is about 9 feet 3 inches and a length 344 that is about 12 feet 6 inches. In another embodiment, first module 300 has a footprint between about ninety (90) square feet (sqft) and about one hundred and fifty (150) square feet. It will be appreciated by those skilled in the art that the width and length, and hence the footprint of first module 300, may vary within the scope of the present invention. For example, additional grinders 318, 320 may be added within first module 300 to increase the footprint of module 300. In one embodiment, first module 300 is adapted to process about thirty (30) wafers per hour. In another embodiment, first module 300 is adapted to process between about twenty-nine (29) and about thirty-three (33) 300 mm wafers per hour.

FIG. 6B depicts an alternative embodiment of a grind damage cluster module according to the present invention. Again, the grind damage cluster module 350 may correspond to first module 216 described in conjunction with FIG. 5, and the grinder(s) therein may be grinder 100 as described in FIGS. 2, 3 and/or 4. Module 350 includes many of the same components as the embodiment depicted in FIG. 6A, and like reference numerals are used to identify like components. Module 350 receives wafers or substrates to be processed at portal 312, identified as a send FOUP 312 in FIG. 6B. Wafers are transferred by transfer device 314, shown as wet robot 314, to a preprocessing station 354. In one embodiment, transfer device 314 travels on a track, groove, raised member or other mechanism which allows transfer device 314 to reach several process stations within module 350.

At preprocessing station 354, a coating is applied to one side of the wafer. In one embodiment, a polymer coating is spun on the wafer to provide exemplary coverage. This coating then is cured using ultraviolet (UV) light to provide a low shrink, rapid cured coating on one side of the wafer. In addition to UV curing, curing of the coating may be accomplished by heating and the like. In a particular embodiment, the coating is applied to a thickness between about five (5) microns and about thirty (30) microns.

Once cured, the coating provides a completely or substantially tack free, stress free surface on one side of the wafer. In one embodiment of the present invention, transfer device 314 transfers the wafer to grinder 318, placing the polymer-coated side down on the grinder 318 platen. In one embodiment, the platen is a porous ceramic chuck which uses a vacuum to hold the wafer in place during grinding. The waves created during wafer slicing are absorbed by the coating and not reflected to the front side of the wafer when held down during the grinding process. After the first wafer side is ground on grinder 318, the wafer is flipped over and the second side is ground. As described in conjunction with FIG. 6A, an in situ clean of the wafer may occur before turning the wafer, or the wafer may be cleaned subsequent to grinding of both sides. Again, the second side grinding may occur on grinder 318 or grinder 320. Grinding of the second side removes the cured polymer, and a portion of the second wafer surface resulting in a generally smooth wafer on both sides, with little to no residual surface waves. Additional details on exemplary grinding apparatus and methods are discussed in U.S. application Ser. No. 09/808,748, (Attorney Docket No. 20468-001010), filed on Mar. 15, 2001 and previously incorporated herein by reference.

After grinding on grinder 318 and/or 320, the wafer is transferred to a combined etch/clean station 352 for wafer etch. Again, wafer etching in station 352 removes a smaller amount of wafer material, and hence requires a smaller amount of etchant solutions, than is typically required by prior art processes.

Processing continues through module 350 ostensibly as described in FIG. 6A. The wafer metrology is tested at metrology station 328. Wafers having desired characteristics are transferred by transfer device 336, shown as a dry robot, to out portals 340, identified as receive FOUPS 340 in FIG. 6B. Wafers having some shortcoming or undesirable parameter are placed in a recycle area 342, shown as a buffer FOUP 342, for appropriate disposal.

In one embodiment, module 350 has a width 342 at its widest point of about one hundred and fourteen (114) inches, and a length at its longest point of about one hundred and forty-five inches (145), with a total footprint of about one hundred and fourteen square feet (114 sqft). As will be appreciated by those skilled in the art, the dimensions and footprint of module 350 may vary within the scope of the present invention.

Still another embodiment of a grind damage cluster module according to the present invention is shown in FIG. 6C. FIG. 6C depicts a first module 360 having similar stations and components as module 350 described in FIG. 6B. Module 350 further may incorporate, in some embodiments, grinder 100. However, module 350 is a flow through module, with wafers being received at one end or side of module 350 and exiting an opposite end or side of module 350. Module 360 has FOUPS 312, 342 and 340 grouped together. Such a configuration provides a single entry point into module 360, and hence into clean room environment 310. Transfer devices 314 and 336 again facilitate the movement of wafers from station to station within module 360. As shown in FIGS. 6B and 6C, transfer device 314 travels on mechanism 316, as discussed in conjunction with FIG. 6B. Transfer device 336 operates from a generally fixed position with arms or platens extending therefrom to translate the wafer to the desired processing station. Module 360 further includes station 354 for application of a wafer coating, such as the UV cured polymer coating described above.

The invention has now been described in detail for purposes of clarity and understanding. However, it will be appreciated that certain changes and modifications may be practiced within the scope of the appended claims. For example, the modules may have different layouts, dimensions and footprints than as described above.

What is claimed is:

1. An apparatus for grinding a substrate, said apparatus comprising:
    a first spindle having a first spindle surface;
    an abrasive matrix coupled to a portion of the first spindle surface, the abrasive matrix defining an eccentric-shaped abrasive ring positioned generally adjacent a periphery of the first spindle surface; and
    a second spindle adapted to hold a substrate to be ground, said second spindle offset from said first spindle such that the abrasive ring is positioned above a center of the substrate when the second spindle is in a first position, and the abrasive ring is not positioned above the center of the substrate when the second spindle is in a second position.

2. The apparatus as in claim 1 further comprising a rotation device for rotating said first and second spindles.

3. The apparatus as in claim 1 wherein said first and second spindles are adapted to rotate such that said abrasive matrix passes through a center of said substrate only a portion of the time during which said first spindle completes a 360 degree rotation.

4. The apparatus as in claim 1 wherein said first spindle surface is a circular shaped surface to which said eccentric-shaped abrasive ring is coupled.

5. The apparatus as in claim 1 wherein said first spindle surface is an elliptical shaped surface to which said abrasive ring is coupled, said ring coupled near an edge of said elliptical shaped surface.

6. The apparatus as in claim 1 wherein said abrasive matrix comprises a diamond bit pattern.

7. The apparatus as in claim 1 further comprising a translation device coupled to said first spindle and adapted to translate said first spindle in a back and forth motion.

8. The apparatus as in claim 1 further comprising a translation device coupled to said second spindle and adapted to translate said second spindle in a back and forth motion.

9. The apparatus as in claim 1 wherein said eccentric-shaped abrasive ring is selected from an elliptical shape and an oval shape.

10. The apparatus as in claim 1, wherein said eccentric-shaped abrasive ring further comprises a random abrasive matrix pattern.

11. A substrate grinding apparatus, comprising:
    a first spindle having an abrasive matrix coupled to a first surface of said spindle, said first spindle having a first axis of rotation; and
    a second spindle adapted to hold a substrate to be ground, said second spindle having a second axis of rotation;
    wherein said abrasive matrix defines an eccentric-shaped abrasive ring having a non-circular pattern.

12. The substrate grinding apparatus as in claim 11 wherein said first and second axii of rotation are generally parallel, and said first spindle is offset from said second spindle.

13. The substrate grinding apparatus as in claim 11 wherein said first and second spindles are adapted to rotate such that said abrasive matrix passes through a center of said substrate only a portion of the time during which said first spindle completes a 360 degree rotation.

14. The substrate grinding apparatus as in claim 11 wherein said abrasive matrix comprises a random pattern abrasive matrix.

15. A method of grinding a substrate, said method comprising:
   providing an apparatus as in claim 1;
   positioning said spindles such that said abrasive matrix is in contact with a surface of said substrate; and
   simultaneously rotating said first and second spindles so that said abrasive matrix contacts said substrate surface, said abrasive matrix passing through a center of said substrate surface for only a portion of a time said spindles are rotating.

16. The method of grinding according to claim 15 further comprising translating said first spindle in a back and forth motion while said abrasive matrix is in contact with said surface.

17. The method of grinding according to claim 16 wherein said translating occurs simultaneous with said rotating said first and second spindles.

18. The method of grinding according to claim 15 wherein said first spindle surface comprises a circular shaped surface to which said eccentric-shaped abrasive matrix is coupled.

19. A method of grinding a substrate, said method comprising:
   providing a substrate grinder comprising;
      a first spindle having an abrasive matrix coupled thereto, the abrasive matrix defining an eccentric-shaped abrasive ring positioned generally adjacent a periphery of the first spindle, said first spindle having a first axis of rotation; and
      a second spindle adapted to hold a substrate to be ground, said second spindle having a second axis of rotation;
   positioning said spindles such that at least a portion of said abrasive matrix is in contact with a substrate surface to be ground;
   simultaneously rotating said first and second spindles so that said abrasive matrix contacts said substrate surface; and
   translating said first spindle so that said abrasive matrix passes through a center of said substrate surface for only a portion of a time said first and second spindles are rotating.

* * * * *